US010466072B2

(12) United States Patent
Limvorapun et al.

(10) Patent No.: US 10,466,072 B2
(45) Date of Patent: Nov. 5, 2019

(54) POTENTIOMETER TESTING SYSTEMS AND METHODS

(71) Applicant: THE BOEING COMPANY, Chicago, IL (US)

(72) Inventors: Suhat Limvorapun, Huntington Beach, CA (US); Thomas A. Webb, Huntington Beach, CA (US); Randy L. Brandt, Orange, CA (US)

(73) Assignee: THE BOEING COMPANY, Chicago, IL (US)

( * ) Notice: Subject to any disclaimer, the term of this patent is extended or adjusted under 35 U.S.C. 154(b) by 410 days.

(21) Appl. No.: 15/356,338

(22) Filed: Nov. 18, 2016

(65) Prior Publication Data

US 2018/0143151 A1 May 24, 2018

(51) Int. Cl.
*G01N 27/04* (2006.01)
*G01D 5/165* (2006.01)
*G01D 18/00* (2006.01)
*G01R 31/04* (2006.01)

(52) U.S. Cl.
CPC ............. *G01D 5/165* (2013.01); *G01D 18/00* (2013.01); *G01R 31/043* (2013.01)

(58) Field of Classification Search
None
See application file for complete search history.

(56) References Cited

U.S. PATENT DOCUMENTS

| 4,667,518 A * | 5/1987 | Iden ........................ G01D 5/165 29/620 |
| 2006/0103500 A1 * | 5/2006 | Kessler .................. H01O 10/08 338/195 |
| 2006/0119466 A1 * | 6/2006 | Flentge .................. G01D 5/165 338/15 |
| 2008/0048900 A1 * | 2/2008 | Voicu .................. H03M 1/0678 341/144 |

* cited by examiner

*Primary Examiner* — Jermele M Hollington
*Assistant Examiner* — Suresh K Rajaputra
(74) *Attorney, Agent, or Firm* — Toler Law Group, PC

(57) ABSTRACT

A system includes analysis circuitry. The analysis circuitry is configured to determine a first electrical resistance between a first terminal of a potentiometer and a second terminal of the potentiometer. The analysis circuitry is additionally configured to determine a second electrical resistance between the first terminal and a wiper terminal of the potentiometer. The analysis circuitry is additionally configured to determine a third electrical resistance between the second terminal and the wiper terminal. The analysis circuitry is additionally configured to determine a wiper resistance of the potentiometer based on the first electrical resistance, the second electrical resistance, and the third electrical resistance. The system additionally includes an output interface coupled to the analysis circuitry and configured to generate an output indicative of the wiper resistance.

20 Claims, 5 Drawing Sheets

POTENTIOMETER TESTING SYSTEMS AND METHODS

FIELD OF THE DISCLOSURE

The present disclosure relates testing potentiometers.

BACKGROUND

Potentiometers may be used in a variety of applications, such as in position sensors. The position sensors may be employed in different environments, such as aerospace, submersible, automotive, and industrial control panel environments. Potentiometers may be tested by disassembling the potentiometer and testing the parts using a digital multi-meter. However, testing the potentiometer when disassembled may not produce results reflective of operation of the potentiometer when assembled or during use.

SUMMARY

In a particular implementation a system includes analysis circuitry. The analysis circuitry is configured to determine a first electrical resistance between a first terminal of a potentiometer and a second terminal of the potentiometer. The analysis circuitry is additionally configured to determine a second electrical resistance between the first terminal and a wiper terminal of the potentiometer. The analysis circuitry is additionally configured to determine a third electrical resistance between the second terminal and the wiper terminal. The analysis circuitry is additionally configured to determine a wiper resistance of the potentiometer based on the first electrical resistance, the second electrical resistance, and the third electrical resistance. The system additionally includes an output interface coupled to the analysis circuitry and configured to generate an output indicative of the wiper resistance.

In a particular implementation, a system includes a measurement network. The measurement network is configured to measure a first value of an electrical parameter, a second value of the electrical parameter, and a third value of the electrical parameter. The first value of the electrical parameter is associated with a first electrical resistance between a first terminal of a potentiometer and a second terminal of the potentiometer. The second value of the electrical parameter is associated with a second electrical resistance between the first terminal and a wiper terminal of the potentiometer. The third value of the electrical parameter is associated with a third electrical resistance between the second terminal and the wiper terminal. The system additionally includes analysis circuitry configured to determine a wiper resistance of the potentiometer based on the first electrical resistance, the second electrical resistance, and the third electrical resistance.

In a particular implementation, a method for determining a wiper resistance of a potentiometer includes measuring a first value of an electrical parameter. The first value is indicative of a first electrical resistance between a first terminal of a potentiometer and a second terminal of the potentiometer. The method includes measuring a second value of the electrical parameter. The second value is indicative of a second electrical resistance between the first terminal and a wiper terminal of a wiper of the potentiometer. The method includes measuring a third value of the electrical parameter. The third value is indicative of a third electrical resistance between the second terminal and the wiper terminal. The method additionally includes determining a wiper resistance based on the first electrical resistance, the second electrical resistance, and the third electrical resistance.

The features, functions, and advantages described herein can be achieved independently in various embodiments or may be combined in yet other embodiments, further details of which are disclosed with reference to the following description and drawings.

DETAILED DESCRIPTION

Particular embodiments of the present disclosure are described below with reference to the drawings. In the description, common features are designated by common reference numbers throughout the drawings.

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Implementations disclosed herein enable testing a potentiometer without having to disassemble the potentiometer. Additionally, the testing enables identifying when the potentiometer has been assembled improperly. Implementations include measuring values indicative of three electrical resistances between three different pairs of first, second, and wiper terminals associated with a resistance plate; determining the three electrical resistances; and determining a wiper resistance based on the three electrical resistances. Additionally, the wiper or the resistance plate may be rotated so that multiple wiper resistances may be determined. The wiper resistances are used to evaluate the potentiometer. For example, when multiple wiper resistances are determined at different positions of the wiper relative to the resistance plate, particular patterns or tendencies of the wiper resistances may be indicative of different faults, such as an uneven resistance plate, a curved or misaligned rod coupled to the resistance plate or to the wiper, or a contamination.

Figure 1:
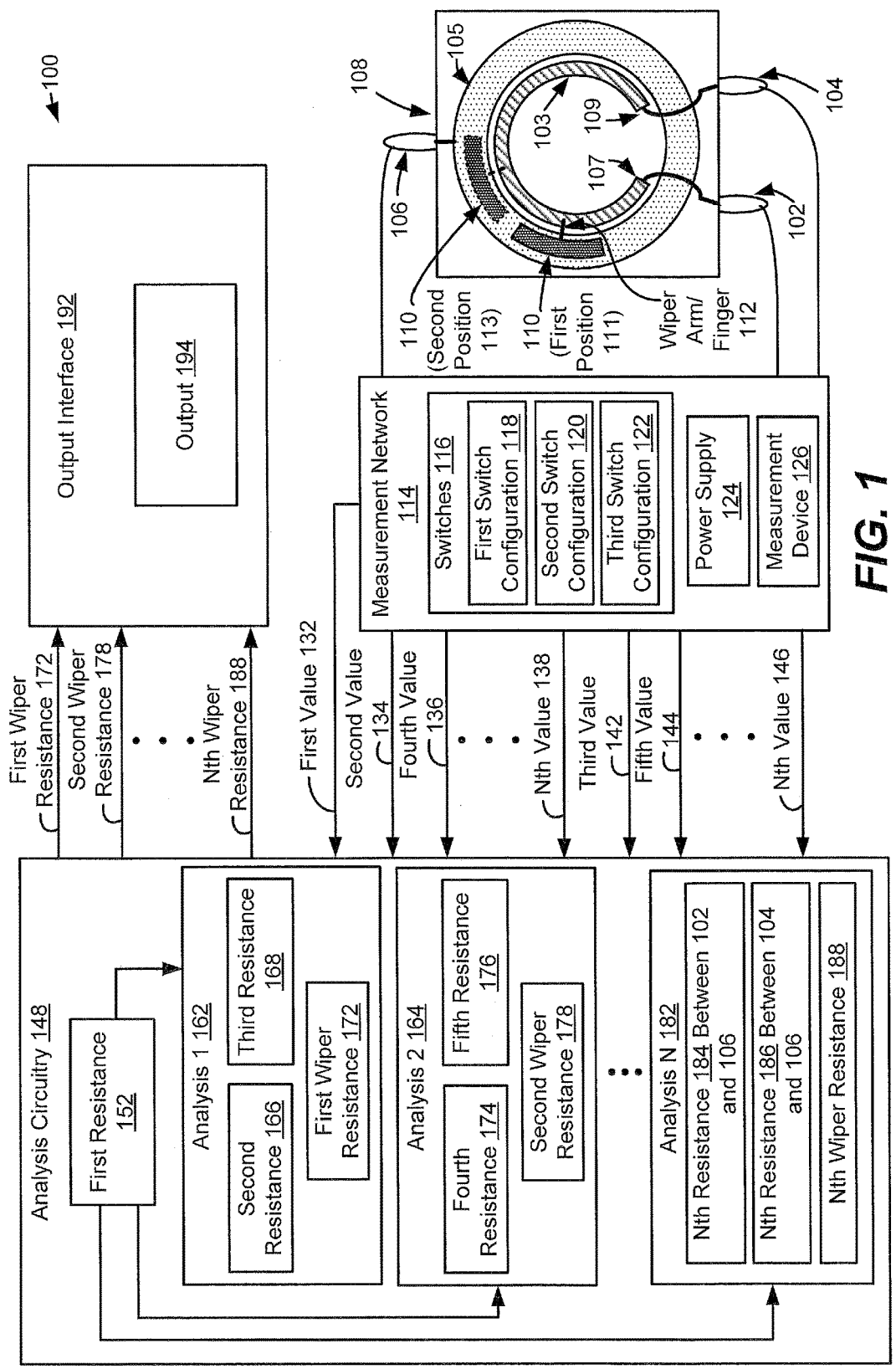
FIG. 1 illustrates an example of a potentiometer testing system configured to determine a wiper resistance of a potentiometer.

FIG. 1 illustrates a block diagram of an example potentiometer testing system 100 to test a potentiometer 108. The potentiometer 108 includes a resistance plate 103 and a wiper 110. The wiper 110 includes a wiper anti. 112 to contact the resistance plate 103. The wiper 110 is rotatable to contact the resistance plate 103 at different positions. Alternatively or additionally, the resistance plate 103 is rotatable such that the wiper 110 contacts the resistance plate 103 at different positions as the resistance plate 103 rotates. In some examples, the wiper 110 or the resistance plate 103 is coupled to a shaft or rod [not illustrated]. To rotate the wiper 110 or the resistance plate 103 (e.g., to change a position of the wiper 110 relative to the resistance plate 103), an actuator [not illustrated], such as a motor [not illustrated], is coupled to the shaft to rotate the shaft. As described in more detail below, in some implementations, measurements are made at (and wiper resistances are determined for) one or more positions (e.g., N positions) of the wiper 110 relative to resistance plate 103. In some examples, the actuator is configurable to rotate the wiper 110 or the resistance plate 103 through a plurality of complete rotations and measurements may be made at multiple positions during each of the rotations.

Figure 5:
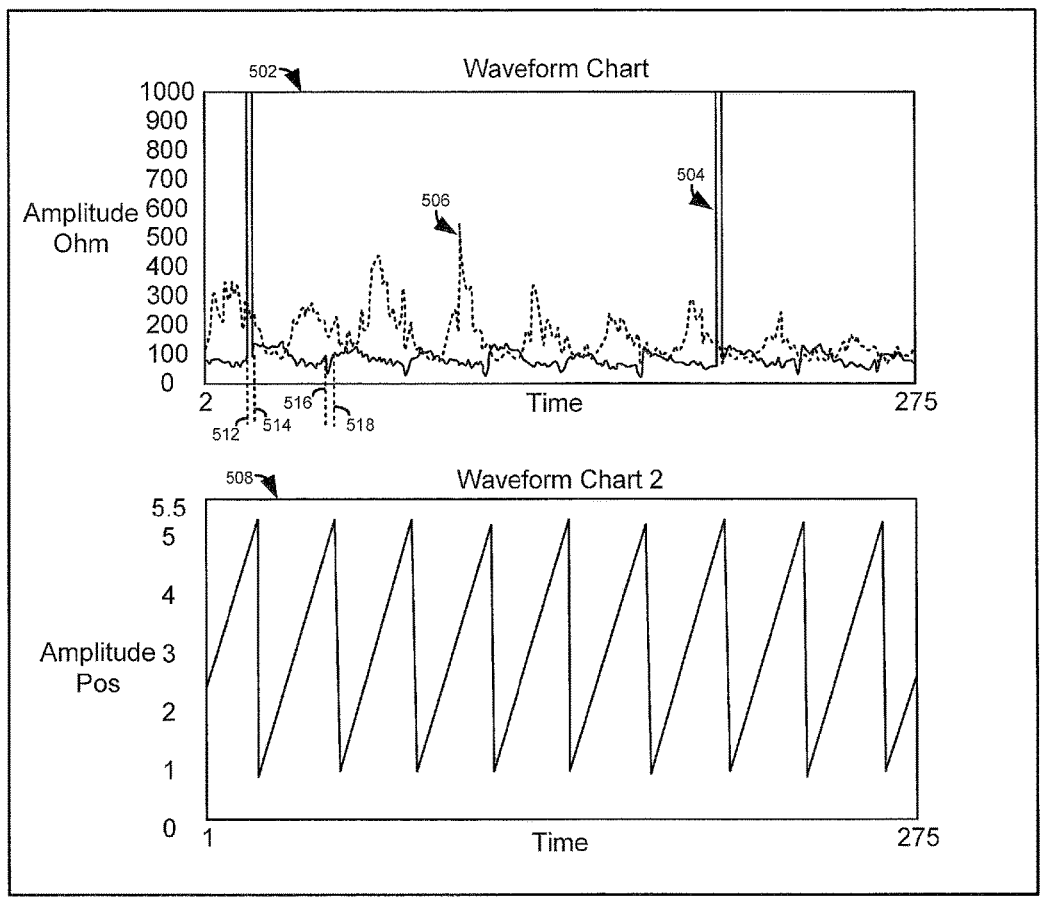
FIG. 5 illustrates an example of an output provided by an output interface of the potentiometer testing system of FIG. 1.

Although the description of FIG. 1 focuses on a single wiper 110 and resistance plate 103, in other implementations the potentiometer 108 may include multiple wipers (e.g., a primary wiper and a redundant wiper) and multiple resistance plates (e.g., a primary resistance plate and a redundant resistance plate), and the potentiometer testing system 100 may be configured to test (e.g., simultaneously measure) multiple wipers and resistance plates using the techniques and equipment described below with reference to the wiper 110 and the resistance plate 103. Additionally, as an example, FIG. 5 illustrates an example output plot of a primary and redundant wiper/resistance plate implementation.

The wiper 110 is coupled to a wiper terminal 106 of the potentiometer 108. In the implementation illustrated in FIG. 1, the wiper 110 is coupled to the wiper terminal 106 via a conductive member 105 (e.g., an O-ring or a slip ring). The potentiometer 108 includes a first terminal 102 coupled to a first end 107 of the resistance plate 103 and a second terminal 104 coupled to a second end 109 of the resistance plate 103.

The potentiometer testing system 100 of FIG. 1 includes a measurement network 114. The measurement network 114 includes a power supply 124. For example, the power supply 124 may correspond to a current source or a voltage supply. The measurement network 114 includes one or more switches 116. The one or more switches 116 are configured to selectively direct current flow (supplied or induced by the power supply 124) between pairs of the first terminal 102, the second terminal 104, and the wiper terminal 106. For example, the power supply 124 may correspond to a current source, and the one or more switches 116 are configurable in a first switch configuration 118 to cause current from the current source to flow between the first terminal 102 and the second terminal 104, in a second switch configuration 120 to cause current from the current source to flow between the first terminal 102 and the wiper terminal 106, and/or in a third switch configuration 122 to cause current from the current source to flow between the second terminal 104 and the wiper terminal 106. An example circuit diagram of an equivalent circuit when the power supply 124 corresponds to a current source and when the one or more switches 116 are configured in the first switch configuration 118 is described below with reference to FIG. 2. An example circuit diagram of an equivalent circuit when the power supply 124 corresponds to a current source and when the one or more switches 116 are configured in the second switch configuration 120 is described below with reference to FIG. 3. An example circuit diagram of an equivalent circuit when the power supply 124 corresponds to a current source and when the one or more switches 116 are configured in the third switch configuration 122 is described below with reference to FIG. 4.

The measurement network 114 includes a measurement device 126 configured to measure a first value 132 of an electrical parameter, a second value 134 of the electrical parameter, and a third value 142 of the electrical parameter. In some implementations, the measurement device 126 includes a voltage sensor.

The first value 132 of the electrical parameter is associated with a first electrical resistance between the first terminal 102 and the second terminal 104. The first value 132 of the electrical parameter may be associated with the first electrical resistance when the first electrical resistance is derivable based on the first value 132 of the electrical parameter. To illustrate, the electrical parameter may correspond to voltage (between the first terminal 102 and the second terminal 104) that presents responsive to application of a current to the first terminal 102 or to the second terminal 104 while the one or more switches 116 are configured in the first switch configuration 118. In this example, the first electrical resistance may be derived based on the measured voltage between the first terminal 102 and the second terminal 104 using Equation 1, where $R_{12}$ corresponds to the electrical resistance between the first terminal 102 and the second terminal 104, I corresponds to the current applied to the first terminal 102 or to the second terminal 104, and $V_{12}$ corresponds to the voltage between the first terminal 102 and the second terminal 104 responsive to application of the current I to the first terminal 102 or to the second terminal 104 when the one or more switches 116 are configured in the first switch configuration 118.

$$R_{12} = \frac{V_{12}}{I} \quad \text{Equation 1}$$

The second value 134 of the electrical parameter is associated with a second electrical resistance between the first terminal 102 and the wiper terminal 106. The second value 134 of the electrical parameter may be associated with the second electrical resistance when the second electrical resistance is derivable based on the second value 134 of the electrical parameter. To illustrate, the electrical parameter may correspond to voltage (between the first terminal 102 and the wiper terminal 106) that presents responsive to application of a current to the first terminal 102 or to the wiper terminal 106 while the one or more switches 116 are configured in the second switch configuration 120. In this example, the second electrical resistance may be derived based on the measured voltage between the first terminal 102 and the wiper terminal 106 using Equation 2, where $R_{1W}^1$ corresponds to the electrical resistance between the first terminal 102 and the wiper terminal 106 when the wiper 110 is in the first position 111 relative to the resistance plate 103, I corresponds to the current applied to the first terminal 102 or to the wiper terminal 106, and $V_{1W}^1$ corresponds to the voltage between the first terminal 102 and the wiper terminal 106 responsive to application of the current I to the first terminal 102 or to the wiper terminal 106 when the one or more switches 116 are configured in the second switch configuration 120 and when the wiper 110 is in the first position 111 relative to the resistance plate 103.

$$R_{1W}^1 = \frac{V_{1W}^1}{I} \qquad \text{Equation 2}$$

The third value 142 of the electrical parameter is associated with a third electrical resistance between the second terminal 104 and the wiper terminal 106. The third value 142 of the electrical parameter may be associated with the third electrical resistance when the third electrical resistance is derivable based on the third value 142 of the electrical parameter. To illustrate, the electrical parameter may correspond to voltage (between the second terminal 104 and the wiper terminal 106) that presents responsive to application of a current to the second terminal 104 or to the wiper terminal 106 while the one or more switches 116 are configured in the third switch configuration 122. In this example, the third electrical resistance may be derived based on the measured voltage between the second terminal 104 and the wiper terminal 106 using Equation 3, where $R_{2W}^1$ corresponds to the electrical resistance between the second terminal 104 and the wiper terminal 106 when the wiper 110 is in the first position 111 relative to the resistance plate 103, I corresponds to the current applied to the second terminal 104 or to the wiper terminal 106, and $V_{2W}^1$ corresponds to the voltage between the second terminal 104 and the wiper terminal 106 responsive to application of the current I to the second terminal 104 or to the wiper terminal 106 when the one or more switches 116 are configured in the third switch configuration 122 and when the wiper 110 is in the first position 111 relative to the resistance plate 103.

$$R_{2W}^1 = \frac{V_{2W}^1}{I} \qquad \text{Equation 3}$$

In some examples, the measurement network 114 is configured to measure multiple values of the electrical parameter between the first terminal 102 and the wiper terminal 106 when the wiper 110 is in the first position 111 relative to the resistance plate 103, and multiple values of the electrical parameter between the second terminal 104 and the wiper terminal 106 when the wiper 110 is in the first position 111 relative to the resistance plate 103. Each of the multiple measurements of the electrical parameter between the first terminal 102 and the wiper terminal 106 may be measured at a different contact pressure at an interface of the wiper 110 and the resistance plate 103 (e.g., a "first interface") and/or at a different contact pressure at an interface of the wiper 110 and the conductive member 105 (e.g., a "second interface"). For example, the contact pressures at the first and/or second interfaces may be adjusted N times per position (e.g., at the first position 111) and a value of the electrical parameter associated with the electrical resistance between the first terminal 102 and the wiper terminal 106 may be measured at each of the N contact pressures. Additionally, a value of the electrical parameter associated with the electrical resistance between the second terminal 104 and the wiper terminal 106 may be measured at each of the N contact pressures. One or more of the contact pressures at one or more of the first and/or second interfaces may be changed using an electromechanical positioner to apply different pressures to the wiper 110, to the conductive member 105, or to a component coupled to the wiper 110 and/or to the conductive member 105 to adjust the contact pressures at the first and/or second interfaces.

As an example, the second value 134 and the third value 142 may be measured while first contact pressures are applied at the first and second interfaces. In this example, the contact pressures at the first and/or second interfaces may be adjusted, while the wiper 110 is at the first position 111 relative to the resistance plate 103, to second contact pressures that are different than the first contact pressures. A value (e.g., a fourth value 136) of the electrical parameter associated with an electrical resistance between the first terminal 102 and the wiper terminal 106 at the first position 111 and at the second contact pressures may be measured. Additionally, a value (e.g., a fifth value 144) of the electrical parameter associated with an electrical resistance between the second terminal 104 and the wiper terminal 106 at the first position 111 and at the second contact pressures may be measured.

As another example, the contact pressures at the first and/or second interfaces may be adjusted, while the wiper 110 is at the first position 111, to Nth contact pressures that are different than the first contact pressures and the second contact pressures. A value (e.g., a Nth value 138) of the electrical parameter associated with an electrical resistance between the first terminal 102 and the wiper terminal 106 at the first position 111 and at the Nth contact pressures may be measured. Additionally, a value (e.g., an Nth value 146) of the electrical parameter associated with an electrical resistance between the second terminal 104 and the wiper terminal 106 at the first position 111 and at the Nth contact pressures may be measured.

Thus, the measurement network 114 may be configured to measure values indicative of the electrical resistances between the first terminal 102 and the wiper terminal 106 and between the second terminal 104 and the wiper terminal 106 at multiple contact pressures per position of the wiper 110 relative to the resistance plate 103.

In some examples, the measurement network 114 is configured to measure, at different positions of the wiper 110 relative to the resistance plate 103, multiple values of the electrical parameter associated with the electrical resistance between the first terminal 102 and the wiper terminal 106 and multiple values of the electrical parameter associated with the electrical resistance between the second terminal 104 and the wiper terminal 106.

For example, the wiper 110 or the resistance plate 103 may be rotatable as described above to enable measurements to be taken at N positions of the wiper 110 relative to the resistance plate 103. A value of the electrical parameter associated with the electrical resistance between the first terminal 102 and the wiper terminal 106 may be measured at each of the N positions. Additionally, a value of the electrical parameter associated with the electrical resistance between the second terminal 104 and the wiper terminal 106 may be measured at each of the N positions. In some examples, the wiper 110 is configured to be continuously rotated at a substantially slow rate, and samples (measurements) are made at each of the N positions of the wiper 110.

Subsequent to measuring the second value 134 and the third value 142, the actuator may rotate the wiper 110 to the second position 113, and the measurement network 114 may measure, at the second position 113, a value (e.g., the fourth value 136) of the electrical parameter associated with the electrical resistance between the first terminal 102 and the wiper terminal 106. As another example, the measurement network 114 may measure, at the second position 113 of the wiper 110, a value (e.g., the fifth value 144) of the electrical parameter associated with the electrical resistance between the second terminal 104 and the wiper terminal 106.

As another example, the wiper 110 may be rotated to an Nth position. A value (e.g., an Nth value 138) of the electrical parameter associated with an electrical resistance between the first terminal 102 and the wiper terminal 106 at the Nth position may be measured. Additionally, a value (e.g., an Nth value 146) of the electrical parameter associated with an electrical resistance between the second terminal 104 and the wiper terminal 106 at the Nth position may be measured.

Thus, the measurement network 114 may be configured to measure values indicative of the electrical resistances between the first terminal 102 and the wiper terminal 106 and between the second terminal 104 and the wiper terminal 106 at multiple positions of the wiper 110 relative to the resistance plate 103.

The analysis circuitry 148 may be configured to perform one or more analyses (e.g., N analyses) 162, 164 . . . N, to determine electrical resistances between the first terminal 102 and the wiper terminal 106 and between the second terminal 104 and the wiper terminal 106 at different positions of the wiper 110 and/or at different contact pressures at the first and/or second interfaces. The analysis circuitry 148 may be configured to determine the wiper resistance $R_W$ at each of the N positions of the wiper 110 and/or for each of the N contact pressures based on the first resistance $R_{12}$ and the second and third resistances $R_{1W}$ and $R_{2W}$ for the N positions of the wiper 110 or for the N contact pressures.

For example, the analysis circuitry 148 may be configured to perform a first analysis 162 to determine the second electrical resistance 166, the third electrical resistance 168, and a first wiper resistance 172 associated with the first position 111 and first contact pressures at the first and/or second interfaces. The analysis circuitry 148 may determine the second electrical resistance 166 based on the second measured value 134. To illustrate, the analysis circuitry 148 may be configured to determine the second electrical resistance 166 based on the current I and the voltage $V_{1W}$ (e.g., the second value 134) using the Equation 2. The analysis circuitry 148 may be configured to determine the third electrical resistance 168 based on the third measured value 142. To illustrate, the analysis circuitry 148 may be configured to determine the third electrical resistance 168 based on the current I and the voltage $V_{2W}$ (e.g., the third value 142) using the Equation 3.

The analysis circuitry 148 may be configured to determine the first wiper resistance 172 using Equation 4, where $R_W^1$ corresponds to the first wiper resistance 172, $R_{12}$ corresponds to the first electrical resistance 152, $R_{1W}^1$ corresponds to the second electrical resistance 166, and $R_{2W}^1$ corresponds to the third electrical resistance 168.

$$R_W^1 = \left[\left(\frac{R_{1W}^1}{R_{12}} + \frac{R_{2W}^1}{R_{12}}\right) - 1\right] \times \frac{R_{12}}{2} \qquad \text{Equation 4}$$

Thus, the analysis circuitry 148 may be configured to perform a first analysis for the first position 111 of the wiper 110 and the first contact pressure.

The analysis circuitry 148 may be configured to perform a second analysis 164 to determine the fourth electrical resistance 174, the fifth electrical resistance 176, and a second wiper resistance 178 associated with the second position 113 and/or second contact pressures at the first and/or second interfaces at the first position 111 of the wiper 110.

The analysis circuitry 148 may determine the fourth electrical resistance 174 based on the fourth measured value 136. To illustrate, the analysis circuitry 148 may be configured to determine the fourth electrical resistance 174 based on the current I and the voltage $V_{1W}$ (e.g., the fourth value 136) using the Equation 2. As described above, the fourth value 136 may correspond to the value of the electrical parameter at the second position 113 or at the first position 111 and at second contact pressures at the first and/or second interfaces. Thus, the fourth electrical resistance 174 may correspond to the electrical resistance between the first terminal 102 and the wiper terminal 106 at the second position 113 or at the first position 111 and at the second contact pressures.

The analysis circuitry 148 may be configured to determine the fifth electrical resistance 176 based on the fifth measured value 144. To illustrate, the analysis circuitry 148 may be configured to determine the fifth electrical resistance 176 based on the current I and the voltage $V_{2W}$ (e.g., the fifth value 144) using the Equation 3. As described above, the fifth value 144 may correspond to the value of the electrical parameter at the second position 113 or at the first position 111 and at second contact pressures at the first and/or second interfaces. Thus, the fifth electrical resistance 176 may correspond to the electrical resistance between the second terminal 104 and the wiper terminal 106 at the second position 113 or at the first position 111 and at the second contact pressures.

The analysis circuitry 148 may be configured to determine the second wiper resistance 178 using Equation 5, where $R_W^2$ corresponds to the second wiper resistance 178, $R_{12}$ corresponds to the first electrical resistance 152, $R_{1W}^2$ corresponds to the fourth electrical resistance 174, and $R_{2W}^2$ corresponds to the fifth electrical resistance 176.

$$R_W^2 = \left[\left(\frac{R_{1W}^2}{R_{12}} + \frac{R_{2W}^2}{R_{12}}\right) - 1\right] \times \frac{R_{12}}{2} \qquad \text{Equation 5}$$

Thus, the analysis circuitry 148 may be configured to perform a second analysis for the second position 113 of the wiper 110 or for the first position 111 of the wiper 110 and second contact pressures different than the first contact pressures.

The analysis circuitry 148 may be configured to perform an Nth analysis 182 to determine an Nth electrical resistance 184 between the first terminal 102 and the wiper terminal 106 at the Nth position and/or at Nth contact pressures at the first position 111, an Nth electrical resistance 186 between the second terminal 104 and the wiper terminal 106 at the Nth position and/or at Nth contact pressures at the first position 111, and an Nth wiper resistance 188.

The analysis circuitry 148 may determine the Nth electrical resistance 184 based on the Nth measured value 138. To illustrate, the analysis circuitry 148 may be configured to determine the Nth electrical resistance 184 based on the current I and the voltage $V_{1W}$ (e.g., the Nth value 138) using the Equation 2. As described above, the Nth value 138 may correspond to the value of the electrical parameter at the Nth position or at the first position 111 and at Nth contact pressures at the first and/or second interfaces. Thus, the Nth electrical resistance 184 may correspond to the electrical resistance between the first terminal 102 and the wiper terminal 106 at the Nth position or at the first position 111 and at the Nth contact pressures.

The analysis circuitry 148 may be configured to determine the Nth electrical resistance 186 based on the Nth measured value 146. To illustrate, the analysis circuitry 148 may be configured to determine the Nth electrical resistance 186 based on the current I and the voltage $V_{2W}$ (e.g., the Nth value 146) using the Equation 3. As described above, the Nth value 146 may correspond to the value of the electrical parameter at the Nth position or at the first position 111 and at Nth contact pressures at the first and/or second interfaces. Thus, the Nth electrical resistance 186 may correspond to the electrical resistance between the second terminal 104 and the wiper terminal 106 at the Nth position or at the first position 111 and at the Nth contact pressures.

The analysis circuitry 148 may be configured to determine the Nth wiper resistance 188 using Equation 6, where $R_W^N$ corresponds to the second wiper resistance 178, $R_{12}$ corresponds to the first electrical resistance 152, $R_{1W}^N$ corresponds to the Nth electrical resistance 184, and $R_{2W}^N$ corresponds to the Nth electrical resistance 186.

$$R_W^N = \left[\left(\frac{R_{1W}^N}{R_{12}} + \frac{R_{2W}^N}{R_{12}}\right) - 1\right] \times \frac{R_{12}}{2} \qquad \text{Equation 6}$$

Thus, the analysis circuitry 148 may be configured to perform N analyses for N positions of the wiper 110 and/or for the first position 111 of the wiper 110 and N different contact pressures.

The potentiometer testing system 100 of FIG. 1 additionally includes an output interface 192 to provide an output 194. The output interface 192 may correspond to an electronic display. The output 194 may include one or more plots. The one or more plots may plot a wiper resistance versus wiper 110 position. The potentiometer testing system 100 may include a position sensor [not illustrated] to sense a position of the wiper 110. The analysis circuitry 148 may be configured to associate the determined wiper resistances with the respective position of the wiper 110 for which the wiper resistance was determined. For example, the analysis circuitry 148 may determine N wiper resistances per wiper 110 rotation, and the output 194 may plot each of the N wiper resistances against the wiper 110 position at which the wiper resistance was determined.

The wiper resistances and/or the output 194 may be indicative of a quality of the potentiometer 108. The wiper resistance at a particular position of the wiper 110 may correspond to or be substantially based on an intrinsic resistance of the wiper 110, a contact resistance at the first interface (e.g., at an interface between the resistance plate 103 and the wiper arm 112) at the particular position of the wiper 110, and a contact resistance at the second interface (e.g., at an interface between the wiper 110 and the conductive member 105) at the particular position of the wiper 110.

A contact resistance at the first interface at the particular position of the wiper 110 may be influenced by a contact pressure at the first interface when the wiper 110 is positioned at the particular position. For example, contact resistance at an interface of two materials is generally inversely related to contact pressure at the interface. In particular, contact resistance generally decreases as contact pressure increases.

To illustrate, a contact pressure at the first interface may be based on a distance between the resistance plate 103 and the wiper 110 or the wiper arm 112. For example, when the wiper 110 is closer to the resistance plate 103, the contact pressure at the first interface may be higher. A consistently high wiper resistance may be indicative of a low pressure contact between the wiper 110 and the resistance plate 103. For example, when N wiper resistances are determined as described above, and most or all of the N wiper resistances are substantially higher than an expected wiper resistance (e.g., as indicated in a standard or specification), it may be concluded that a contact pressure between the wiper arm 112 and the resistance plate 103 is low.

As another example, a contact pressure at the second interface may be based on a distance between the conductive member 105 and the wiper 110 as described above with reference to the wiper 110 and the resistance plate 103. A consistently high wiper resistance may be indicative of a low pressure contact between the wiper 110 and the conductive member 105. For example, when N wiper resistances are determined as described above, and most or all of the N wiper resistances are substantially higher than an expected wiper resistance (e.g., as indicated in a standard or specification), it may be concluded that a contact pressure between the wiper 110 and the conductive member 105 is low.

A varying wiper resistance may be indicative of an uneven resistance plate 103, indicative of an uneven conductive member 105, or indicative of a shaft coupled to the resistance plate 103 or to the wiper 110 not being straight, causing a wobble in the rotation of the resistance plate 103 or the wiper 110. To illustrate, the resistance plate 103 may be warped or may be mounted crookedly such that the surface of the resistance plate 103 is not evenly distanced from a base of the wiper arm 112 as the wiper 110 rotates. For example, a base of the wiper arm 112 may be closer to a surface of the resistance plate 103 when the wiper 110 is at a first position 111 than when the wiper 110 is at a second position 113. In this example, a greater contact pressure may be applied when the wiper 110 is at the first position 111 than when the wiper 110 is at the second position 113. When the output 194 indicates a repeatable cyclical periodic substantially smooth increase of resistance followed by reduction of resistance, it may be determined that the resistance plate 103 is uneven, that the conductive member 105 is uneven, or that the shaft coupled to the resistance plate 103 or the wiper 110 is not straight, causing a wobble in the rotation of the resistance plate 103 or the wiper 110.

Additionally or alternatively, the contact resistance at the first interface at the particular position of the wiper 110 may be influenced by contaminants on the surface of the wiper arm 112 or the resistance plate 103 at the location of the first interface at the particular position of the wiper 110. A varying wiper resistance may be indicative of a local spot contamination of the resistance plate 103. For example, when the output 194 indicates a repeatable cyclical periodic sudden increase of resistance followed by a reduction of resistance, it may be determined that a local spot contaminant is on the resistance plate 103 at the contact point of the wiper 110 and the resistance plate 103 at the position of the high resistance. The contaminant may include an oxidation or other high resistance contaminant.

Therefore, the wiper resistance at a particular position of the wiper 110 may be based on and thus indicative of a contact pressure and/or surface contamination at the particular position. Thus, the wiper resistances and/or the output 194 may be used to determine whether the potentiometer 108 satisfies a quality standard.

Figure 2:
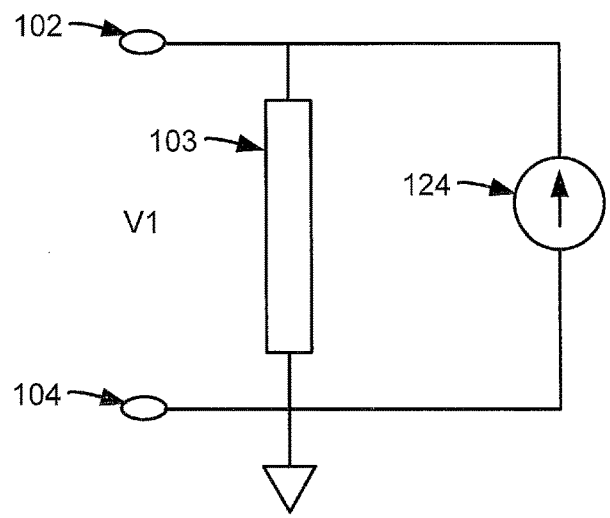
FIG. 2 illustrates an example of an equivalent circuit of the potentiometer of FIG. 1 and a power supply of a measurement system of the potentiometer testing system of FIG. 1 when one or more switches of the measurement system are configured in a first switch configuration.

FIG. 2 shows a circuit diagram of an equivalent circuit presented when the one or more switches 116 are configured in the first switch configuration 118. In the first switch configuration 118, the wiper terminal 106 is de-coupled. In the first switch configuration 118, current from the current source flows between the first terminal 102 and the second terminal 104 and across the resistance plate 103.

Figure 3:
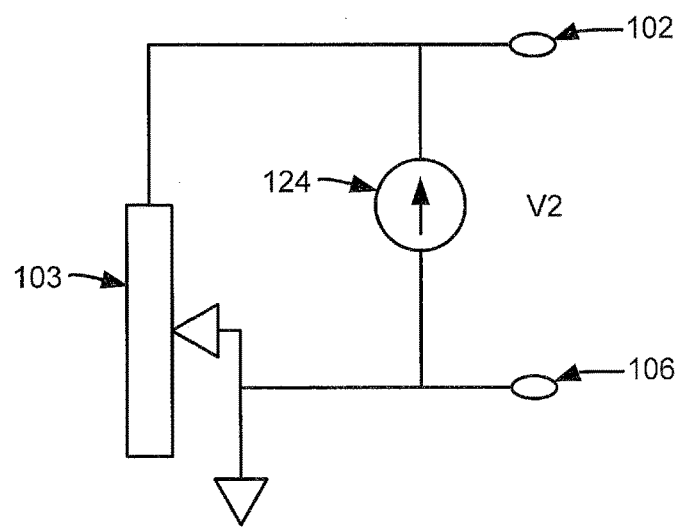
FIG. 3 illustrates an example of an equivalent circuit of the potentiometer of FIG. 1 and a power supply of a measurement system of the potentiometer testing system of FIG. 1 when one or more switches of the measurement system are configured in a second switch configuration.

As another example, FIG. 3 shows a circuit diagram of an equivalent circuit presented when the one or more switches 116 are configured in the second switch configuration 120. In the second switch configuration 120, the second terminal 104 is de-coupled. In the second switch configuration 120, current from the current source flows between the first terminal 102 and the wiper terminal 106 and across a portion of the resistance plate 103 between the first terminal 102 and the wiper terminal 106.

Figure 4:
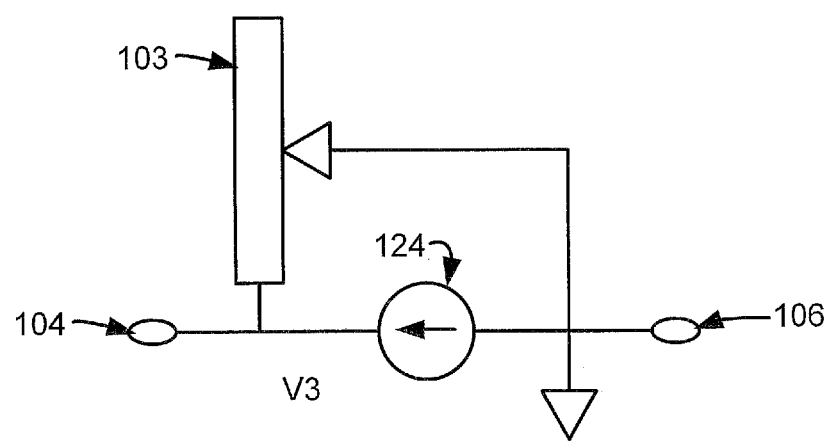
FIG. 4 illustrates an example of an equivalent circuit of the potentiometer of FIG. 1 and a power supply of a measurement system of the potentiometer testing system of FIG. 1 when one or more switches of the measurement system are configured in a third switch configuration.

As another example, FIG. 4 shows a circuit diagram of an equivalent circuit presented when the one or more switches 116 are configured in the third switch configuration 122. In the third switch configuration 122, the first terminal 102 is de-coupled. In the third switch configuration 122, current from the current source flows between the second terminal 104 and the wiper terminal 106 and across a portion of the resistance plate 103 between the second terminal 104 and the wiper terminal 106.

FIG. 5 illustrates an example of an output 194 of the output interface 192 of FIG. 1. The output 194 of FIG. 5 includes a graph 502 and a graph 508.

The graph 502 plots wiper resistance in ohms (y-axis) versus time (x-axis). The graph 502 includes a plot 504 for a first wiper (e.g., a primary wiper) and a plot 506 for a second wiper (e.g., a redundant wiper). The first wiper or the primary wiper may correspond to the wiper 110 of FIG. 1. The plots 504 and 506 include wiper resistances during multiple rotations of the primary and redundant wipers relative to respective resistance plates. For example, the period between lines 514 and 518 corresponds to a first rotation of the first wiper (e.g., the wiper 110 of FIG. 1) relative to the resistance plate (e.g., the resistance plate 103 of FIG. 1), with the portion between lines 516 and 518 corresponding to a dead band (a discontinuity in the resistance plate 103 between the first end 107 and the second end 109 of the resistance plate 103). The large spikes (e.g., the portion between lines 512 and 514) in the plot 504 also correspond to dead bands. As indicated by the plot 504, the wiper resistance for the primary wiper is relatively constant (e.g., has low variance), indicating that the wiper contact is satisfactory. In contrast, the plot 506 indicates substantial variance in the wiper resistance of the redundant wiper, indicating poor contact or a contaminant at portions of the redundant wiper and the redundant resistance plate.

The graph 508 plots position of the wiper (y-axis) versus time (x-axis). Each sawtooth of the graph 508 corresponds to a complete rotation of the wiper (e.g., the 110 of FIG. 1) relative to the resistance plate (e.g., the resistance plate 103 of FIG. 1). As indicated by the graph 508, wiper resistances for the primary wiper and the redundant wiper are determined during multiple rotations of the primary wiper and the redundant wiper relative to the primary resistance plate and the redundant resistance plate, respectively.

Figure 6:
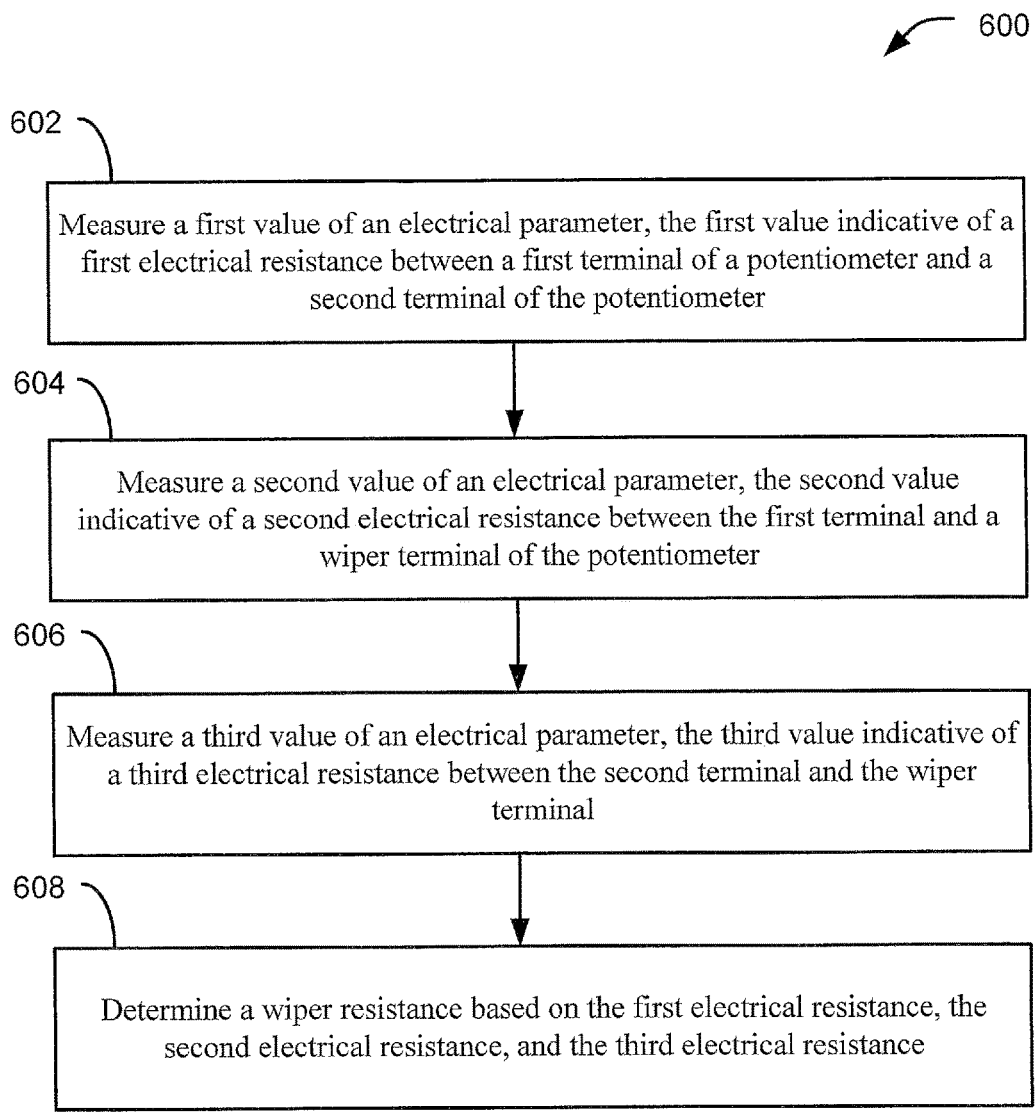
FIG. 6 is a flow chart that illustrates a particular example of a method of determining a wiper resistance of a potentiometer to test the potentiometer.

FIG. 6 illustrates a method 600 for determining a wiper resistance of a potentiometer. The method 600 may be performed by the potentiometer testing system 100 of FIG. 1. The potentiometer may correspond to the potentiometer 108 of FIG. 1.

The method 600 includes, at 602, measuring a first value of an electrical parameter. The first value is indicative of a first electrical resistance between a first terminal of a potentiometer and a second terminal of the potentiometer. The first value may correspond to the first value 132 described above with reference to FIG. 1, the first terminal may correspond to the first terminal 102 described above with reference to FIG. 1, and the second terminal may correspond to the second terminal 104 described above with reference to FIG. 1. For example, the electrical parameter may correspond to voltage and the first value may be indicative of a voltage between the first terminal 102 and the second terminal 104 during application of current to the first terminal 102 or to the second terminal 104 while the one or more switches 116 are in the first switch configuration 118 as described above with reference to FIGS. 1 and 2.

The method 600 further includes, at 604, measuring a second value of the electrical parameter. The second value is indicative of a second electrical resistance between the first terminal and a wiper terminal of the potentiometer. The second value may correspond to the second value described above with reference to FIG. 1, the first terminal may correspond to the first terminal 102 described above with reference to FIG. 1, and the wiper terminal may correspond to the wiper terminal 106 described above with reference to FIG. 1. For example, the electrical parameter may correspond to voltage and the second value may be indicative of a voltage between the first terminal 102 and the wiper terminal 106 during application of current to the first terminal 102 or to the wiper terminal 106 while the one or more switches 116 are in the second switch configuration 120 as described above with reference to FIGS. 1 and 3. The current applied while the one or more switches are in the second switch configuration may be substantially the same as the current applied while the one or more switches are in the first configuration.

The method 600 further includes, at 606, measuring a third value of the electrical parameter. The third value is indicative of a third electrical resistance between the second terminal and the wiper terminal. The third value may correspond to the third value described above with reference to FIG. 1, the second terminal may correspond to the second terminal 104 described above with reference to FIG. 1, and the wiper terminal may correspond to the wiper terminal 106 described above with reference to FIG. 1. For example, the electrical parameter may correspond to voltage and the third value may be indicative of a voltage between the second terminal 104 and the wiper terminal 106 during application of current to the second terminal 104 or to the wiper terminal 106 while the one or more switches 116 are in the third switch configuration 122 as described above with reference to FIGS. 1 and 4. The current applied while the one or more switches are in the third switch configuration may be substantially the same as the current applied while the one or more switches are in the first and/or second switch configurations.

The method 600 further includes, at 608, determining a wiper resistance based on the first electrical resistance, the second electrical resistance, and the third electrical resistance. The first electrical resistance may correspond to the first electrical resistance 152 described above with reference to FIG. 1, the second electrical resistance may correspond to the second electrical resistance 166 described above with reference to FIG. 1, and the third electrical resistance may correspond to the third electrical resistance 168 described above with reference to FIG. 1. The wiper resistance may be determined based on the first, second, and third resistances according to Equation 4 as described above with reference to FIG. 1.

In some implementations, determining the wiper resistance includes determining the first electrical resistance based on the first value of the electrical parameter, determining the second electrical resistance based on the second value of the electrical parameter, and determining the third electrical resistance based on the third value of the electrical parameter. In some examples, the first electrical resistance may be determined based on the first value using the Equation 1 described above with reference to FIG. 1. The second electrical resistance may be determined based on the second value using the Equation 2 described above with reference to FIG. 1. The third electrical resistance may be determined based on the third value using the Equation 3 described above with reference to FIG. 1.

In some implementations, the method 600 further includes configuring one or more switches in a first switch configuration to cause current from a current source to flow between the first terminal and the second terminal. In these implementations, the method 600 further includes configuring the one or more switches in a second switch configuration to cause current from the current source to flow between the first terminal and the wiper terminal. In these implementations, the method 600 further includes configuring the one or more switches in a third switch configuration to cause current from the current source to flow between the second terminal and the wiper terminal. The one or more switches may correspond to the one or more switches 116 described above with reference to FIG. 1. The first switch configuration may correspond to the first switch configuration 118 described above with reference to FIGS. 1 and 2. The second switch configuration may correspond to the second switch configuration 120 described above with reference to FIGS. 1 and 3. The third switch configuration may correspond to the third configuration 122 described above with reference to FIGS. 1 and 4. In some examples, the first value of the electrical parameter is measured while the one or more switches are configured in the first switch configuration, the second value of the electrical parameter is measured while the one or more switches are configured in the second switch configuration, and the third value of the electrical parameter is measured while the one or more switches are configured in the third switch configuration.

The determined wiper resistance may correspond to a first wiper resistance, such as the first wiper resistance 172 described above with reference to FIG. 1. The first wiper resistance may be determined at a first contact pressure. In some implementations, the method 600 additionally includes changing a contact pressure at the interface of the wiper and the resistance plate from the first contact pressure to a second contact pressure. For example, the contact pressure may be changed using an electromechanical positioner as described above with reference to FIG. 1. In these implementations, the method 600 may additionally include determining a second wiper resistance at the same position of the wiper at which the first wiper resistance was determined. For example, the second wiper resistance may be determined by measuring a fourth value at the second contact pressure and measuring a fifth value at the second contact pressure, determining fourth and fifth electrical resistances based on the third and fourth values, and determining a second wiper resistance based on the first electrical resistance, the fourth electrical resistance, and the fifth electrical resistance using the Equation 5 as described above with reference to FIG. 1.

In some implementations, the second and third values are measured at a first position of the wiper, and the method 600 additionally includes rotating the wiper 110 to a second position. The wiper may be rotated using a motor as described above. In these implementations, the method 600 further includes measuring a fourth value of the electrical parameter. The fourth value is indicative of a fourth electrical resistance between the first terminal 102 and the wiper terminal 106 at the second position of the wiper 110. The fourth value may correspond to the fourth value 136 described above with reference to FIG. 1. In these implementations, the method 600 further includes measuring a fifth value of the electrical parameter. The fifth value is indicative of a fifth electrical resistance between the second terminal 104 and the wiper terminal 106 at the second position of the wiper 110. The fifth value may correspond to the fifth value 144 described above with reference to FIG. 1. In these implementations, the method 600 further includes determining a second wiper resistance at the second position based on the first electrical resistance, the fourth electrical resistance, and the fifth electrical resistance.

In some implementations, the method 600 additionally includes determining whether the potentiometer 108 satisfies a quality standard based on the first wiper resistance and the second wiper resistance. The quality standard may be satisfied when the wiper resistances (e.g., the first wiper resistance and the second wiper resistance) determined for the different positions of the wiper relative to the resistance plate are within an acceptable range of resistances (e.g., as indicated in a standard or specification) and/or exhibit a variance that satisfies a threshold (e.g., the variance is relatively low) as indicated in a standard or specification. For example, with reference to the plot 504 of FIG. 5, the wiper resistance may be substantially consistent (e.g., exhibits low variance), indicating that the wiper contact is satisfactory. In this example, the potentiometer 108 may be determined to satisfy the quality standard. In contrast, the plot 506 of FIG. 5 indicates substantial variance in the wiper resistance of the redundant wiper, indicating poor contact or a contaminant at portions of the redundant wiper and the redundant resistance plate. In this example, a potentiometer that includes the redundant wiper may be determined to not satisfy the quality standard.

The illustrations of the examples described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than shown in the figures or one or more method steps may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. As the following claims reflect, the claimed subject matter may be directed to less than all of the features of any of the disclosed examples.

Examples described above illustrate but do not limit the disclosure. It should also be understood that numerous modifications and variations are possible in accordance with the principles of the present disclosure. Accordingly, the scope of the disclosure is defined by the following claims and their equivalents.

What is claimed is:

1. An apparatus comprising:
   analysis circuitry configured to:
      determine a first electrical resistance between a first terminal of a potentiometer and a second terminal of the potentiometer, wherein determining the first electrical resistance includes coupling the first terminal and the second terminal to a power source to generate a first current between the first terminal and the second terminal, the first current having an electrical characteristic;
      determine a second electrical resistance between the first terminal and a wiper terminal of the potentiometer, wherein determining the second electrical resistance includes coupling the first terminal and the wiper terminal to the power source to generate a second current between the first terminal and the wiper terminal, the second current having the electrical characteristic;
      determine a third electrical resistance between the second terminal and the wiper terminal, wherein determining the third electrical resistance includes coupling the second terminal and the wiper terminal to the power source to generate a third current between the second terminal and the wiper terminal, the third current having the electrical characteristic; and
      determine a wiper resistance of the potentiometer based on the first electrical resistance, the second electrical resistance, and the third electrical resistance; and
   an output interface coupled to the analysis circuitry and configured to generate an output indicative of the wiper resistance.

2. The apparatus of claim 1, wherein the electrical characteristic corresponds to a voltage difference between two terminals.

3. The apparatus of claim 1, wherein the electrical characteristic corresponds to a current magnitude.

4. The apparatus of claim 1, wherein the output includes a plot of multiple positions of a wiper of the potentiometer versus the wiper resistance determined at the multiple positions.

5. The apparatus of claim 4, wherein the output interface includes an electronic display.

6. A system comprising:
   a measurement network configured to:
      measure a first value of an electrical parameter, wherein the first value of the electrical parameter is associated with a first electrical resistance between a first terminal of a potentiometer and a second terminal of the potentiometer, wherein the first value is measured by coupling the first terminal and the second terminal to a power source to generate a first current between the first terminal and the second terminal, the first current having an electrical characteristic;
      measure a second value of the electrical parameter, wherein the second value of the electrical parameter is associated with a second electrical resistance between the first terminal and a wiper terminal of the potentiometer, wherein the second value is measured by coupling the first terminal and the wiper terminal to the power source to generate a second current between the first terminal and the second terminal, the second current having the electrical characteristic; and
      measure a third value of the electrical parameter, wherein the third value of the electrical parameter is associated with a third electrical resistance between the second terminal and the wiper terminal, wherein the third value is measured by coupling the second terminal and the wiper terminal to the power source to generate a third current between the first terminal and the second terminal, the third current having the electrical characteristic; and
   analysis circuitry configured to determine a wiper resistance of the potentiometer based on the first electrical resistance, the second electrical resistance, and the third electrical resistance.

7. The system of claim 6, wherein the electrical parameter corresponds to voltage, wherein the first value of the electrical parameter corresponds to a first voltage between the first terminal and the second terminal, wherein the second value of the electrical parameter corresponds to a second voltage between the first terminal and the wiper terminal, and wherein the third value of the electrical parameter corresponds to a third voltage between the second terminal and the wiper terminal.

8. The system of claim 7, wherein the electrical characteristic corresponds to a current magnitude, wherein the first voltage is measured during application of the first current to the first terminal and to the second terminal, wherein the second voltage is measured during application of the second current to the first terminal and to the wiper terminal, and wherein the third voltage is measured during application of the third current to the second terminal and to the wiper terminal.

9. The system of claim 6, wherein the measurement network includes a plurality of switches configured to selectively direct current flow between pairs of the first terminal, the second terminal, and the wiper terminal.

10. The system of claim 6, wherein the measurement network includes one or more switches that are configurable:
   in a first switch configuration to cause the first current between the first terminal and the second terminal;
   in a second switch configuration to cause the second current between the first terminal and the wiper terminal; and
   in a third switch configuration to cause the third current between the second terminal and the wiper terminal.

11. The system of claim 6, wherein the wiper resistance includes an intrinsic electrical resistance of a wiper of the potentiometer and includes a contact resistance due to interfacing the wiper and a resistance plate of the potentiometer.

12. A method for determining a wiper resistance of a potentiometer, the method comprising:

measuring a first value of an electrical parameter, the first value indicative of a first electrical resistance between a first terminal of a potentiometer and a second terminal of the potentiometer, wherein measuring the first value includes coupling the first terminal and the second terminal to a power source to generate a first current between the first terminal and the second terminal, the first current having an electrical characteristic;

measuring a second value of the electrical parameter, the second value indicative of a second electrical resistance between the first terminal and a wiper terminal of a wiper of the potentiometer, wherein measuring the second value includes coupling the first terminal and the wiper terminal to the power source to generate a second current between the first terminal and the wiper terminal, the second current having the electrical characteristic;

measuring a third value of the electrical parameter, the third value indicative of a third electrical resistance between the second terminal and the wiper terminal, wherein measuring the third value includes coupling the second terminal and the wiper terminal to the power source to generate a third current between the second terminal and the wiper terminal, the third current having the electrical characteristic; and determining a wiper resistance based on the first electrical resistance, the second electrical resistance, and the third electrical resistance.

13. The method of claim 12, wherein the electrical parameter corresponds to voltage, wherein the first value of the electrical parameter corresponds to a first voltage between the first terminal and the second terminal, wherein the second value of the electrical parameter corresponds to a second voltage between the first terminal and the wiper terminal, and wherein the third value of the electrical parameter corresponds to a third voltage between the second terminal and the wiper terminal.

14. The method of claim 12, wherein determining the wiper resistance comprises:
   determining the first electrical resistance based on the first value of the electrical parameter;
   determining the second electrical resistance based on the second value of the electrical parameter; and
   determining the third electrical resistance based on the third value of the electrical parameter.

15. The method of claim 12, further comprising:
   configuring one or more switches in a first switch configuration to cause the first current from the power source to flow between the first terminal and the second terminal;
   configuring the one or more switches in a second switch configuration to cause the second current from the power source to flow between the first terminal and the wiper terminal; and
   configuring the one or more switches in a third switch configuration to cause the third current from the power source to flow between the second terminal and the wiper terminal.

16. The method of claim 12, wherein the wiper resistance includes an intrinsic electrical resistance of the wiper and a contact resistance due to interfacing the wiper and a resistance plate of the potentiometer.

17. The method of claim 16, wherein the wiper resistance corresponds to a first wiper resistance at a first position of the wiper and at a first contact pressure at an interface of the wiper and the resistance plate, and further comprising:
   changing a contact pressure at the interface of the wiper and the resistance plate from the first contact pressure to a second contact pressure; and
   determining a second wiper resistance at the first position of the wiper and at the second contact pressure.

18. The method of claim 12, wherein the second value and the third value are measured at a first position of a wiper of the potentiometer, and further comprising rotating the wiper to a second position.

19. The method of claim 18, wherein the wiper resistance corresponds to a first wiper resistance, and further comprising:
   measuring a fourth value of the electrical parameter, the fourth value indicative of a fourth electrical resistance between the first terminal and the wiper terminal at the second position of the wiper, wherein measuring the fourth value includes coupling the first terminal and the second terminal to the power source to generate a fourth current between the first terminal and the wiper terminal, the fourth current having the electrical characteristic;
   measuring a fifth value of the electrical parameter, the fifth value indicative of a fifth electrical resistance between the second terminal and the wiper terminal at the second position of the wiper, wherein measuring the fifth value includes coupling the first terminal and the wiper terminal to the power source to generate a fifth current between the second terminal and the wiper terminal, the fifth current having the electrical characteristic; and
   determining a second wiper resistance at the second position based on the first electrical resistance, the fourth electrical resistance, and the fifth electrical resistance.

20. The method of claim 19, further comprising determining whether the potentiometer satisfies a quality standard based on the first wiper resistance and the second wiper resistance.

* * * * *